United States Patent [19]

Rajeevakumar

[11] Patent Number: 5,065,273
[45] Date of Patent: Nov. 12, 1991

[54] HIGH CAPACITY DRAM TRENCH CAPACITOR AND METHODS OF FABRICATING SAME

[75] Inventor: Thekkemadathil V. Rajeevakumar, Scarsdale, N.Y.

[73] Assignee: International Business Machines Corporation, Armonk, N.Y.

[21] Appl. No.: 622,257

[22] Filed: Dec. 4, 1990

[51] Int. Cl.⁵ .................. H01G 4/06; H01L 21/265; H01C 29/78
[52] U.S. Cl. ................................ 361/313; 357/23.6; 437/52
[58] Field of Search .................. 361/311, 312, 313; 437/52; 357/23.6, 51

[56] References Cited

U.S. PATENT DOCUMENTS

| | | | |
|---|---|---|---|
| 4,577,395 | 3/1986 | Shibata | 29/576 C |
| 4,704,368 | 11/1987 | Goth et al. | 437/60 |
| 4,734,384 | 3/1988 | Tsuchiya | 437/52 |
| 4,784,969 | 11/1988 | Nitayama | 437/41 |
| 4,786,954 | 11/1988 | Morie et al. | 357/23.6 |
| 4,798,794 | 1/1989 | Ogura et al. | 437/41 |
| 4,801,989 | 1/1989 | Taguchi | 357/23.6 |
| 4,803,535 | 2/1989 | Taguchi | 357/23.6 |
| 4,829,017 | 5/1989 | Mahli | 437/47 |
| 4,958,318 | 9/1990 | Harari | 365/149 |
| 4,978,634 | 12/1990 | Shen et al. | 437/52 |

OTHER PUBLICATIONS

"CMOS Process for Titanium Salicide Bridging of a Trench and Simultaneously Allowing for True Gate Isolation", IBM Technical Discl. Bulletin, vol. 29, No. 3, Aug. 1986.

"Folded Bitline Configuration", IBM Discl. Bulletin, vol. 30, No. 3, Aug. 1987.

"Process to Make Self-Aligned Dynamic Random-Access Memory Cells", IBM Discl. Bulletin, vol. 30, No. 8, Jan. 1988.

"New Process and Layout Enhancement of the SSPT Cell From an Open Bitline to a Folded Bitline Structure", IBM Discl. Bulletin, vol. 32, No. 3B, Aug. 1989.

"A Substrate-Plate Trench-Capacitor (SPT) Memory Cell for Dynamic RAM's", IEEE Jrnl. of Solid State Circuits, vol. SC-21, No. 5, Oct. 1986, by Nicky Chau-Chun et al.

Primary Examiner—Donald A. Griffin
Attorney, Agent, or Firm—Perman & Green

[57] ABSTRACT

A trench capacitor and a method of forming same within an integrated circuit. The capacitor includes a first plate electrode having a surface area comprised of an inner surface area of the trench and an outer surface area of an upstanding pillar structure that is formed within the trench and which extends upwardly from a bottom surface thereof. The pillar structure is physically and electrically contiguous with the semiconductor substrate and has the same type of electrical conductivity. The capacitor further includes a second plate electrode comprised of a region of electrically conductive material that substantially fills a volume of the trench. The capacitor further includes a thin layer of dielectric material interposed between the first plate electrode and the second plate electrode. The second plate electrode is conductively coupled to a planar access device through a conductive, self-aligned surface strap.

27 Claims, 5 Drawing Sheets

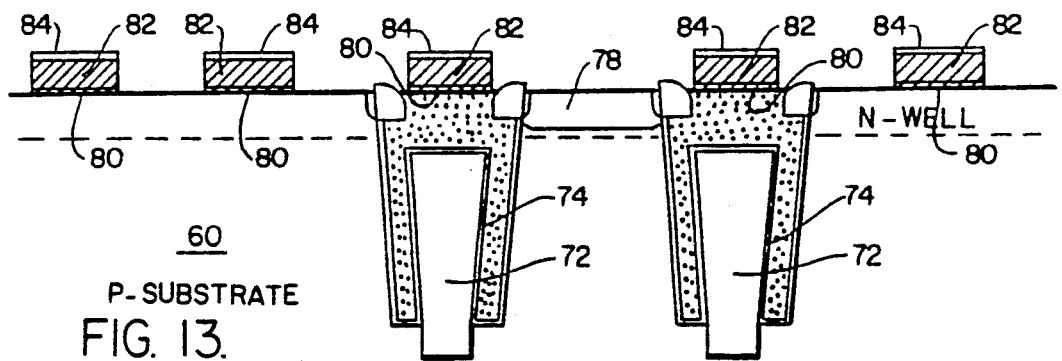
FIG. 13.
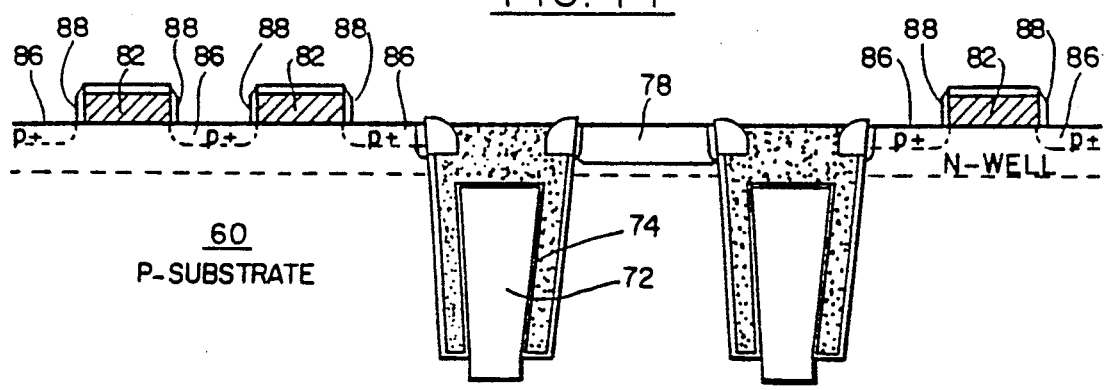
FIG. 14
FIG. 15
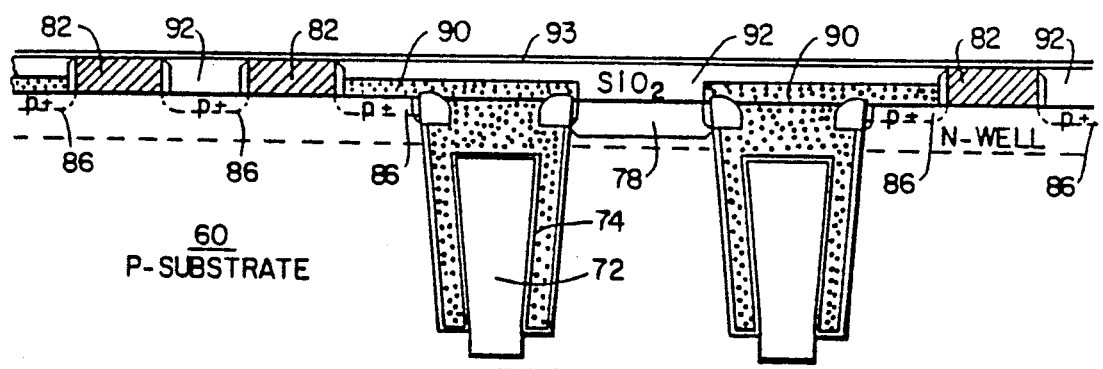
FIG. 16
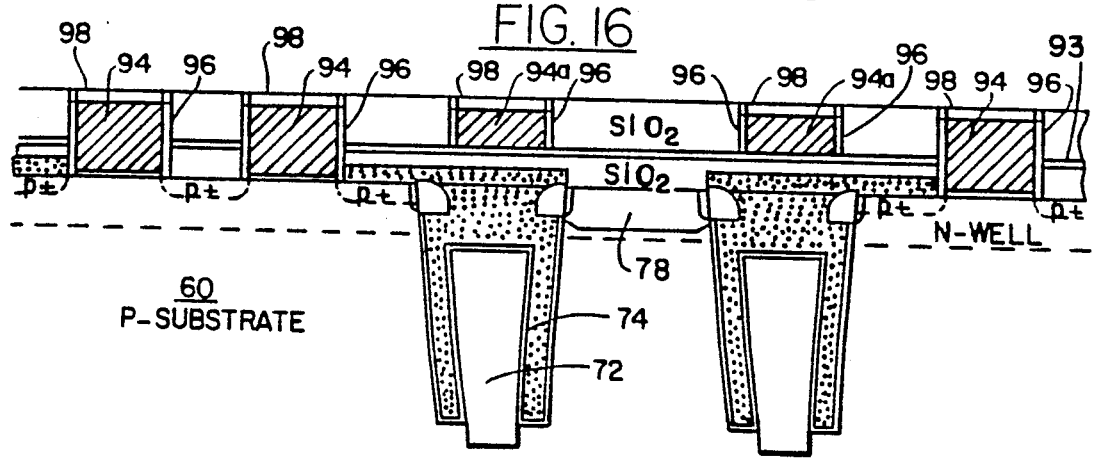

HIGH CAPACITY DRAM TRENCH CAPACITOR AND METHODS OF FABRICATING SAME

FIELD OF THE INVENTION

This invention relates generally to integrated circuit devices and fabrication methodologies and, in particular, to a high capacity trench capacitor and methods of fabricating same.

BACKGROUND OF THE INVENTION:

In an article entitled "A Substrate-Plate Trench-Capacitor (SPT) Memory Cell for Dynamic RAM's", IEEE Journal of Solid State Circuits, Vol. SC-21, No. 5, October 1986, Nicky Chau-Chun Lu et al. describe a dynamic random access memory (DRAM) cell employing a trench capacitor with a grounded substrate plate. A cell array is located inside of a well with the trench capacitor extending from a planar surface through the well and into a heavily doped substrate. Polysilicon deposited within the trench is connected to a source region of a transfer device. The polysilicon functions as a charge storage node while the bulk silicon surrounding the trench serves as a capacitor plate electrode.

In this and other trench capacitor devices, such as those described below, the total charge storing capacity of the trench capacitor is a function of the area of the trench inside walls. However, as devices are scaled downwards in size in order to increase packing density and memory capacity this area is also reduced. As a result, existing trench capacitor fabrication techniques place a lower limit on the size of memory cells and, thus, also on a maximum memory capacity that can be realized within a specified integrated circuit area.

U.S. Patents that relate to various aspects of trench capacitor technology include the following which are listed in chronological order.

In U.S. Pat. No. 4,577,395, issued Mar. 25, 1986, and entitled, "Method of Manufacturing Semiconductor Memory Device Having Trench Memory Capacitor", T. Shibata discloses a semiconductor substrate that is selectively etched so as to form a first groove in an element isolation region. An insulation film is buried in the first groove. The semiconductor substrate is further selectively etched and the insulation film buried in the first groove is employed as an etching mask so as to form second grooves in the respective memory capacitor forming regions.

In commonly assigned U.S. Pat. No. 4,704,368, issued Nov. 3, 1987, and entitled, "Method of Making Trench-Incorporated Monolithic Semiconductor Capacitor and High Density Dynamic Memory Cells Including the Capacitor", Goth et al. disclose a capacitor formed by an isolated region of silicon material which functions as a first capacitor plate, a doped polysilicon layer provided on the vertical walls of a mesa serving as a second capacitor plate, and a thin dielectric layer interposed between the two plates.

In U.S. Pat. No. 4,734,384 issued Mar. 29, 1988, and entitled, "Process for Manufacturing Semiconductor Memory Device", Tsuchiya discloses a memory cell having a capacitor element that utilizes a trench or moat formed in a semiconductor substrate, and a MISFET. One of the electrodes of the capacitor element is connected to the MISFET at the side wall of the upper end of the moat for forming the capacitor element. The electrode is connected in self alignment with a semiconductor region which serves as either the source or drain of the MISFET.

In U.S. Pat. No. 4,784,969 issued Nov. 15, 1988, and entitled, "Method of Manufacturing a Semiconductor Memory Device", Nitayama discloses the steps of forming a groove in a capacitor-forming region of a semiconductor substrate and providing a capacitor electrode covering the inner surface of the groove and a first contact hole. An interconnection electrode layer insulating film is formed over surfaces of the capacitor electrode and an interconnection electrode, forming a gate insulating film on a portion of the surface of the semiconductor substrate which lies between the capacitor electrode and interconnection electrode.

In U.S. Pat. No. 4,786,954 issued Nov. 22, 1988, and entitled, "Dynamic Ram Cell With Trench Surrounded Switching Element", Morie et al. disclose memory cells including at least one capacitor and a trench formed from one major surface of the semiconductor substrate so as to surround at least one memory cell.

In U.S. Pat. No. 4,798,794, issued Jan. 17, 1989, and entitled, "Method for Manufacturing Dynamic Memory Cell", Ogura et al. disclose an insulating film for capacitor formation formed on the inner surface of a hole within a P+ layer (first conductive layer) formed over a P− substrate. A conductive layer acting as a capacitor electrode is formed on the insulating film. With the conductive layer as a mask, an N type is doped into the P+ layer to form a second conductive layer. A MOS transistor is formed in a surface portion of the second conductive layer.

In U.S. Pat. No. 4,801,989 issued Jan. 31, 1989, and entitled, "Dynamic Random Access Memory Having Trench Capacitor With Polysilicon Lined Lower Electrode", Taguchi discloses a dynamic random access memory having a trench capacitor. A first conductive layer is formed on all inner surfaces of the trench except for a region adjacent to the opening portion of the trench. A dielectric layer is formed on the first conductive layer exposed in the trench and the surface of the semiconductor substrate, and a second conductive layer of another conduction type is filled in the trench through the dielectric layer. The first conductive layer, the dielectric layer, and the second conductive layer constitute the storage capacitor.

In U.S. Pat. No. 4,803,535 issued Feb. 7, 1989, and entitled, "Dynamic Random Access Memory Trench Capacitor", Taguchi discloses a trench capacitor that includes a semiconductor substrate, a trench formed in the substrate, and an insulating layer formed on an inner surface of the trench and having a bottom opening. A first conductive layer is formed at the bottom opening position and on the insulating layer, the first conductive layer being ohmically connected to the semiconductor substrate at the bottom opening. The device includes further a dielectric layer formed on the first conductive layer and a second conductive layer formed on the dielectric layer so as to fill the trench. The first conductive layer, the dielectric layer, and the second conductive layer constitute a charge storage capacitor. A MIS transistor is formed in the semiconductor substrate such that the second conductive layer is ohmically connected to a source or drain region of the transistor.

In U.S. Pat. No. 4,829,017, issued May 9, 1989, entitled "Method for Lubricating (sic) a High Capacity DRAM Cell" S. Mahli discloses a trench capacitor that underlies a transistor 30. A capacitor plate 52 is a core enclosed annularly by dielectric insulation 54. Another semiconductor capacitor plate 56 encircles the dielectric isolation. The core plate 52 is of an opposite conductivity type (N-type) than the outer surrounding plate 56 (P-type).

In U.S. Pat. No. 4,958,318, issued Sep. 18, 1990, and entitled, "Sidewall Capacitor Dram Cell", Harari discloses a dynamic RAM that is said to be provided with enhanced charge storage capacity by increasing the surface area between two electrodes of the storage capacitor. A first electrode consists of a thick conductive layer whose vertical sidewalls provide the extra surface area for charge storage. A second electrode is used to partially planarize the surface topology.

IBM Disclosure Bulletin from Vol. 29, No. 3, August 1986, entitled "CMOS Process For Titanium Salicide Bridging of a Trench and Simultaneously Allowing For True Gate Isolation" discloses a CMOS process sequence utilizing salicide to bridge a trench (vertical capacitor) and to also provide for true isolation between a gate, source and drain.

IBM Disclosure Bulletin from Vol. 30, No. 3, August 1987, entitled "Folded Bitline Configuration" discloses in FIG. 1 a memory cell having trench capacitors 1 and 2 in a substrate 3 each connected to a respective source 4 and sharing a common drain junction 5 and a common bitline 6. Word lines 7 and 8 are connected to respective polysilicon transfer gates. The bitline is constructed using one layer of interconnection line among associated cells.

IBM Disclosure Bulletin from Vol. 30, No. 8, January 1988, entitled, "Process To Make Self-Aligned Dynamic Random-Access Memory Cells" discloses trench technology that is used to make small dynamic random-access memory (DRAM) cells. Vertical transistors are formed on trench sidewalls while plate capacitors are formed below the transistors.

IBM Disclosure Bulletin from Vol. 32, No. 3B, August 1989, entitled, "New Process and Layout Enhancement of the SSPT Cell From an Open Bitline to a Folded Bitline Structure" discloses process and layout enhancements which allow a SSPT cell to be laid out in an efficient folded bitline cell structure.

What is not taught by these patents and journal articles, and what is thus an object of the invention to provide, is a method of fabricating a memory cell, and a memory cell fabricated thereby, having a planar access device and an upstanding pedestal structure disposed within a trench for increasing the inner surface area and the capacity of a trench capacitor.

SUMMARY OF THE INVENTION

The foregoing and other problems are overcome and the object of the invention is realized by a fabrication method that provides a high capacity trench capacitor and a self-aligned access device in a folded bitline type of memory cell. The invention also pertains to trench capacitor fabricated by the method.

In accordance with a method of fabricating a trench capacitor within an integrated circuit there is disclosed the steps of (a) providing a substrate having a major surface, the substrate being comprised of a semiconductor material having a first type of electrical conductivity, and (b) removing a portion of the substrate to form a trench that extends from the surface down into the substrate to a predetermined depth. A further step (c) forms an upstanding pedestal structure within the trench, the pedestal structure being formed to extend upwardly from a bottom surface of the trench to a height that is less than the predetermined depth. The pedestal structure is comprised of a semiconductor material having the first type of electrical conductivity and is electrically and physically continuous with the substrate. Further steps include (d) covering exposed inner surfaces of the trench and exposed outer surfaces of the pedestal structure with a layer comprised of an electrical insulator, and (e) filling a remaining volume of the trench with an electrically conductive material.

In accordance with the invention the inner surfaces of the trench and the outer surfaces of the pedestal structure form a first plate of a capacitor, the layer of electrical insulator forms a capacitor dielectric, and surfaces of the electrically conductive material that are in contact with the layer of electrical insulator form a second plate of the capacitor.

A planar access device is also fabricated upon the substrate and a source or a drain of the access device is conductively coupled to the second plate through a self-aligned surface strap comprised of an electrically conductive material.

The invention also teaches a method of fabricating a wordline that is vertically disposed with regard to an underlying trench and, in particular, to a conductive surface strap that couples the trench capacitor electrode to an access device. This is an improvement over prior art devices wherein wordlines and straps are horizontally disposed, thereby requiring a significant amount of additional device surface area. Furthermore, the invention teaches the fabrication of the wordline in two steps. A first step fabricates the wordline upon the substrate surface to a first thickness and a second step adds an additional thickness to form the completed wordline. Contemporaneously with the adding of the additional thickness the vertically disposed wordlines are formed.

BRIEF DESCRIPTION OF THE DRAWING

The above set forth and other features of the invention are made more apparent in the ensuing Detailed Description of the Invention when read in conjunction with the attached Drawing, wherein:

FIGS. 10-17 are cross-sectional views, not to scale, illustrating a plurality of memory cells being fabricated in accordance with a second method of the invention;

DETAILED DESCRIPTION OF THE INVENTION

Figure 1:
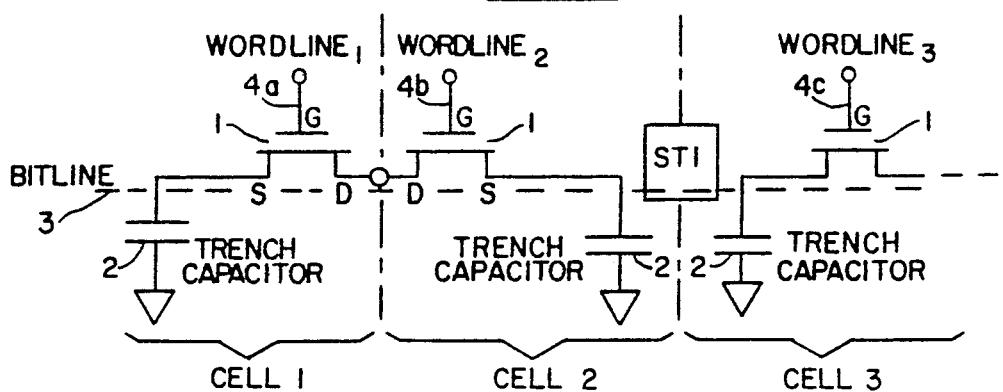
FIG. 1 is a simplified schematic diagram showing a plurality of memory cells constructed in accordance with the invention.

FIG. 1 illustrates schematically a plurality of memory cells (CELL 1, CELL 2, etc.) each of which is comprised of an access device 1 and a trench capacitor 2.

Each trench capacitor 2 is coupled to a source terminal of the associated access device 1 while the device drain terminals are coupled to a folded bitline 3. A gate terminal of each access device is coupled to an associated wordline 4 (WORDLINE 1, WORDLINE 2, etc.). A Shallow Trench Isolation (STI) region is formed between trench capacitors 2 to electrically isolate the capacitors.

The operation of this type of memory cell is known in the art and will not be further described herein.

A first method for fabricating the memory cells is given below. Although the method is presented in the context of a P-type substrate, the processing method is also applicable to N-type substrate material and for arrays having CMOS peripheral devices. The approximate process parameters given are for processing with a minimum lithography dimension of 0.35 microns, although the method may also be practiced with other lithography dimensions.

Figure 2:
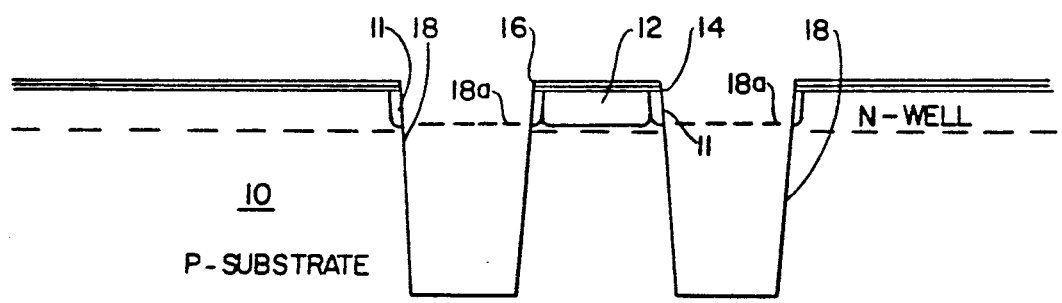
FIGS. 2-7 are cross-sectional views, not to scale, illustrating a plurality of memory cells being fabricated in accordance with a first method of the invention.

Referring to FIG. 2 a low resistivity P-substrate 10 is provided. The substrate 10 is comprised of 100 single crystal P+ Si having a dopant concentration of approximately $10^{19}$ to approximately $10^{20}$ atoms per cubic centimeter. Boron is one suitable dopant.

For this embodiment an n-well is formed to a depth of 1 micron or more into the substrate 10 by ion implantation of phosphorous. The n-well region may or may not extend in depth past the tops of the subsequently formed pedestals. Although the n-well could be formed later in the processing cycle, by implanting it at this point, before the surface of the substrate is differentiated into devices and other structures, a substantially uniform n-well thickness and electrical characteristic is obtained.

A region 12 of Shallow Trench Isolation (STI) is next formed in the substrate 10 in a conventional manner. A layer of $Si_3N_4$, used as a polish stop for the STI formation, is stripped and a thin $SiO_2$ layer 14 is formed. A thicker $Si_3N_4$ layer 16 is deposited upon the $SiO_2$ layer 14. Approximately 800 nm of $SiO_2$ is deposited over the $Si_3N_4$. A photomasking step is used to define the desired location of trenches 18 within the substrate 10, each trench 18 eventually containing a cell storage capacitor. The trenches 18 may be made self-aligned to the STI 12 and the precision of the trench mask is thus not critical. After the trench mask is applied a reactive ion etch (RIE) is employed to etch the $SiO_2$ and the $Si_3N_4$ layer 16. A thin $Si_3N_4$ sidewall spacer 11 is formed around the trench after etching the trench to a depth of approximately 0.5 microns, as shown by the dashed line 18a. This is accomplished by depositing 10 nm thick $Si_3N_4$, after etching the trench to 0.5 microns, and then anisotropically RIE'ing the 10 nm thick $Si_3N_4$ layer. The collar 11 serves to protect the STI 12 from being degraded by further processing steps. Next, the trenches 18 are further etched to a total depth of approximately 4.5 micrometers into the substrate 10, with selectivity to the $SiO_2$ of the STI and $Si_3N_4$. FIG. 2 represents in cross-section the appearance of the memory array after the trenches 18 are etched and after the 800 nm $SiO_2$ layer over the $Si_3N_4$ layer 16 is removed.

Figure 3:
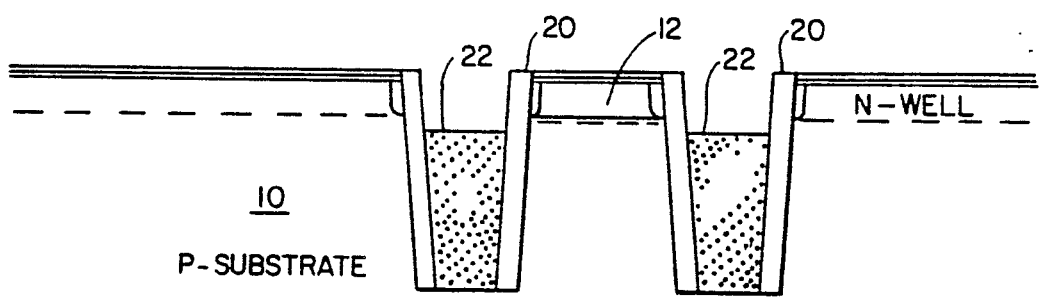

Referring now to FIG. 3, after the 4.5 micrometer deep trenches 18 are etched a layer 20 of $SiO_2$ is deposited by chemical vapor deposition (CVD) to a thickness of approximately 100 nanometers. The layer 20 is selectively RIE'd to form a liner or spacer around the vertical sidewalls of the trenches 18. The $Si_3N_4$ layer 16 previously used in etching the trenches 18 may be employed as an etch stop. The trenches 18 are next each partially filled with p+ polysilicon 22 to a height of approximately four micrometers from the bottom of the trenches. The p+ polysilicon has a dopant concentration approximately equal to that of the p+ substrate 10, the p+ polysilicon dopant concentration being approximately $10^{19}$ to $10^{20}$ boron ions/cm$^3$. FIG. 3 represents in cross-section the appearance of the memory array after the trenches are partially filled with the p+ polysilicon 22.

Figure 4:
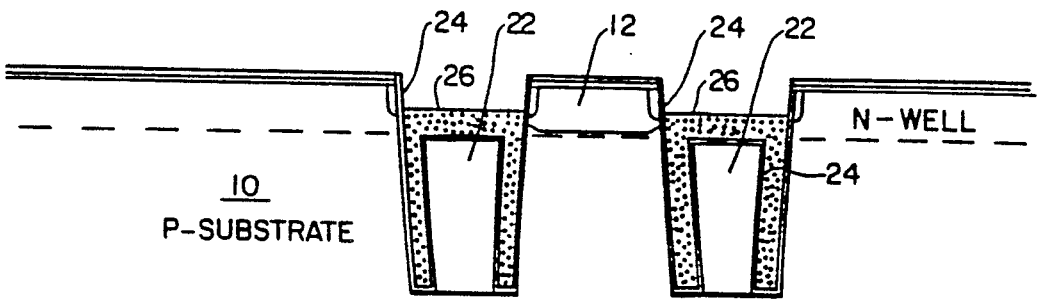

Referring now to FIG. 4 the $SiO_2$ spacer 20 is removed using a HF solution. This leaves, within each trench 18, an upstanding pedestal structure comprised of the p+ polysilicon 22. Each pedestal has a height of approximately four micrometers and top surface dimensions approximately 200 nanometers less than the lateral dimensions of the enclosing trench. Each pedestal structure is also electrically and physically coupled along a bottom surface thereof to the p+ substrate 10. That is, each pedestal may be considered to be an extension of the p+ substrate 10 up into the volume of the associated trench 18. As a result, the inner surface area of the p+ semiconductor material within each trench 18 is significantly increased over the trench structures taught by the prior art.

Next a thin insulator layer 24, having a thickness in the range of approximately 60 Angstroms to 100 Angstroms, is formed inside the trenches 18 and over the polysilicon pedestals 22 to form the capacitor insulator. A thermal oxidation process is employed to form the layer 24 from $SiO_2$. The slightly higher oxidation rate of the polysilicon 22, relative to the monocrystalline substrate 10, may be compensated by decreasing the doping concentration of the polysilicon. The p+ substrate 10 together with the p+ polysilicon pedestals 22 form a plate of the trench storage capacitor 2. Next, 200 nanometer thick p+ polysilicon 26 is deposited inside the trenches 18 to form the opposite capacitor electrode, the p+ polysilicon being deposited such that the p+ polysilicon pedestals 22 are covered. The capacitor electrode may be formed with n+ polysilicon if the array is not placed in an n-well. FIG. 4 represents in cross-section the appearance of the memory array after the deposition of the p+ polysilicon 26.

Figure 5:
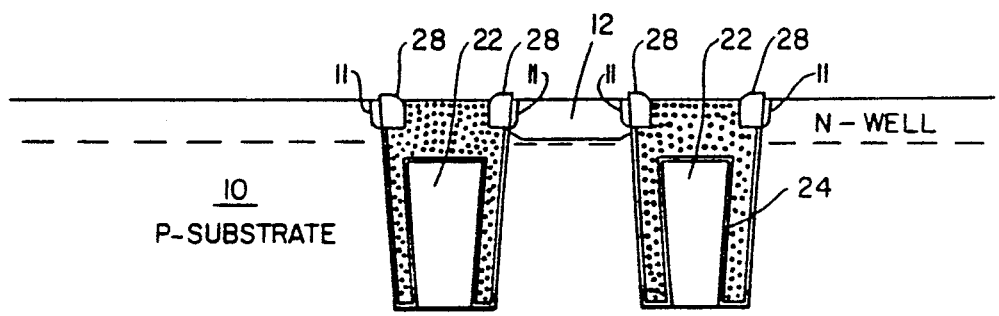

Referring now to FIG. 5 an $SiO_2$ collar 28 having a thickness of approximately 100 nm formed around the trench opening. The collar 28 is formed by a CVD deposition of 100 nm of $SiO_2$ followed by a reactive ion etch of the $SiO_2$, using the previously applied $Si_3N_4$ layer 16 as the etch stop. The trenches are next completely filled with 300 nm of p+ polysilicon. The $Si_3N_4$ layer 16 is stripped off, and the surface is planarized.

Figure 6:
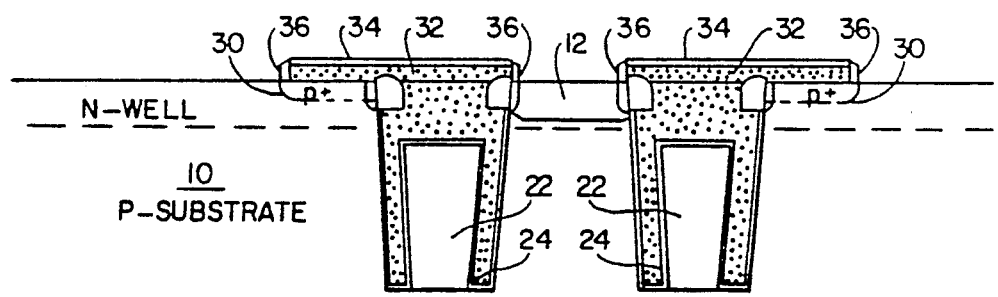

Referring to FIG. 6 a polycide strap 32 is formed by a photolithographic process wherein heavily doped p+ polysilicon, followed by a layer of polycide and another layer of $SiO_2$ (100 nm thick), is deposited and patterned using a strap mask. The p+ source regions are formed by out diffusion. In forming the p+ source regions 30 a Lightly Doped Drain (LDD) structure can be used. An oxide spacer 36 is next formed around the strap 32 to completely insulate the polycide strap 32.

Figure 7:
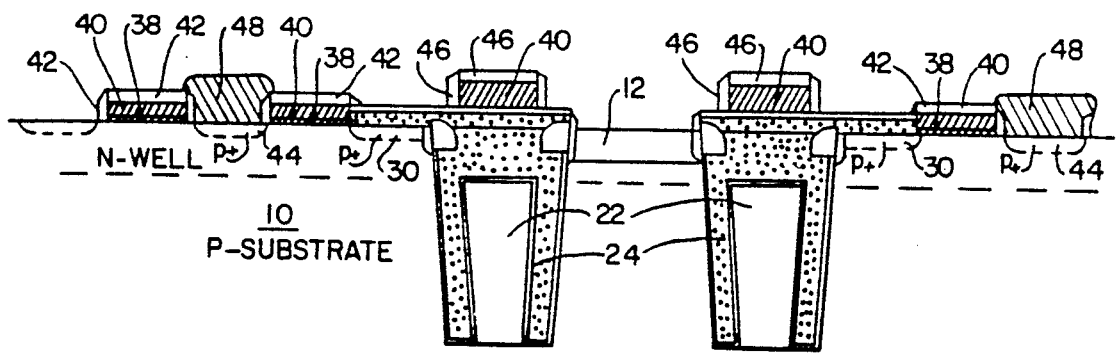

Referring to FIG. 7 a layer 38 of gate oxide is next formed, followed by gate poly 40, 100 nm of $SiO_2$ deposition 42, and gate poly patterning. Next, p+ drain regions 44 are formed by ion implantation. Oxide spacers 46 for the gate poly 40 are also formed. This step is followed by the formation of self-aligned tungsten or other suitable bitline 3 metal contact studs 48.

To complete the fabrication process approximately 200 nm of CVD $SiO_2$ 50 is deposited and planarized. Bitline contact holes are open, followed by metal deposition (M1) 52 and patterning, as shown in FIGS. 8 and 9.

It is noted that the bitline 3 contacts are self-aligned to the gate poly 40, the bitlines 3 being formed by M1. Peripheral devices may be fabricated after the formation of spacers for the polycide strap, along with the access device.

Figure 8:
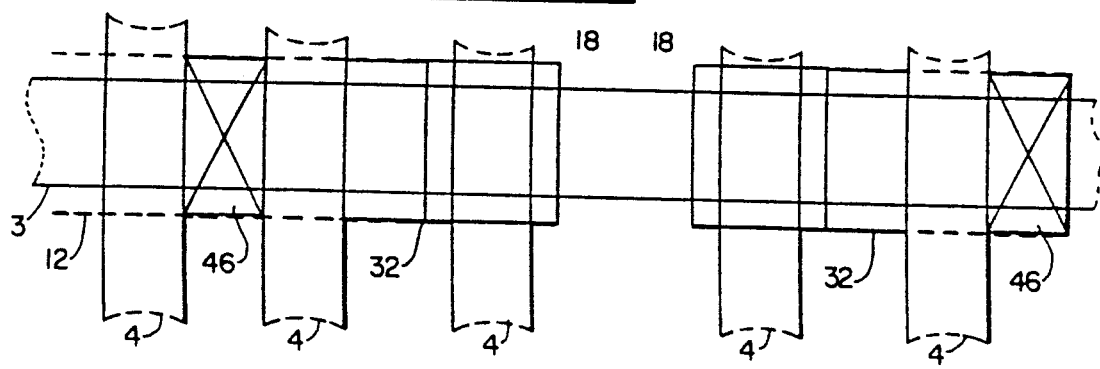
FIG. 8 is a plan view, not to scale, of a plurality of completed memory cells fabricated in accordance with the method illustrated in FIGS. 2-7.
Figure 9:
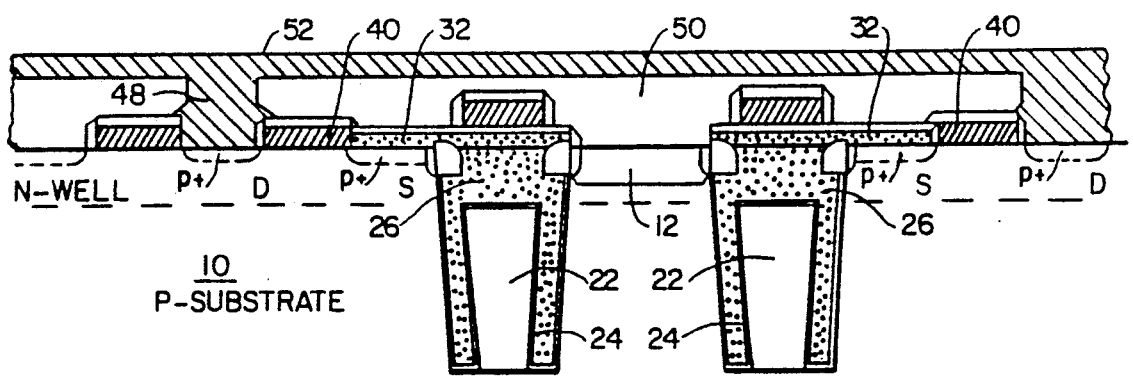
FIG. 9 is a cross-sectional view, not to scale, of the plurality of completed memory cells fabricated in accordance with the method illustrated in FIGS. 2-7.

The schematic top view and vertical cross-section of the completed memory cells are shown in FIGS. 8 and 9, respectively. In accordance with the invention the storage capacitor 2 is formed partly by the trench 18, the trench depth being only 4.5 micrometers. The polysilicon pillar 22 and the substrate 10 together form the cell plate. The outer polysilicon 26 forms the opposite capacitor electrode and is connected to the source of the access transistor 1 through the polycide surface strap 32, the access transistor 1 being self-aligned to the surface strap 32. The $SiO_2$ insulation 50 upon the top of the strap 32 isolates the strap from the passing wordline 4 (not shown). The bitline 3 contacts 48 are self-aligned to the gate polysilicon 40 of the access transistor 1. Although the cell employs only one level of metal (M1), a second level of metal (M2) may be used to strap the wordlines 4 at regular intervals. The cell area is 0.5 microns$^2$, with a minimum lithography dimension of 0.25 microns.

Capacitance values for open and folded bitline structures and other cell parameters are summarized below. Larger storage capacitance can be obtained by increasing the depth of the trench 18.

For a folded bitline architecture of 0.35 microns and an oxide thickness of 70 Angstroms, a capacitance of 50.0 fF is obtained within an area of 0.98 micron$^2$. For a folded bitline architecture of 0.25 microns and an oxide thickness of 50 Angstroms a capacitance of 55.2 fF is achieved within an area of 0.50 micron$^2$.

Referring now to FIGS. 10-19 a further embodiment of the invention is disclosed. The disclosed process sequence may be modified for either an N-array or a P-array with CMOS peripherals. As described, the processing assumes a P-array. The approximate process parameters given are for processing with a minimum lithography dimension of 0.35 microns.

Figure 10:
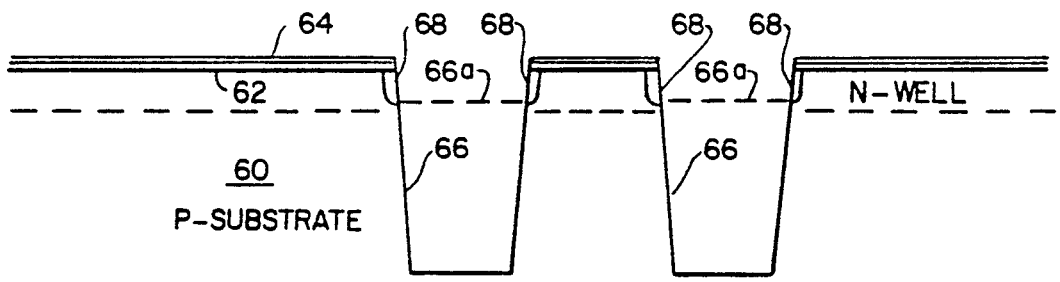

Referring to FIG. 10 a low resistivity P-substrate 60 is provided. The substrate 10 is comprised of 100 single crystal P+ Si having a dopant concentration of approximately $10^{19}$ to approximately $10^{20}$ atoms per cubic centimeter. Boron is one suitable dopant. As in the previous embodiment, an n-well may be implanted at this stage of the processing. A thin layer 62 of $SiO_2$ is then formed on the substrate 60 followed by the blanket deposition of 150 nm thick layer 64 of $Si_3N_4$, followed by approximately 1000 nm of $SiO_2$. After the deposition of a mask suitable for defining the trench openings a RIE is employed to etch the $SiO_2$ and the $Si_3N_4$ layer 64. Trenches 66 having a depth of 0.30 microns (indicated by the dashed lines 66a) are etched into the substrate 60, with selectivity to the $SiO_2$. Next, a 10 nm thick $Si_3N_4$ layer is deposited over the wafer and selectively RIE'd to form a thin sidewall spacer 68 0.30 microns deep around the trench. The trench 66 is then further etched to a depth of approximately six microns, with selectivity to the $SiO_2$.

Figure 11:
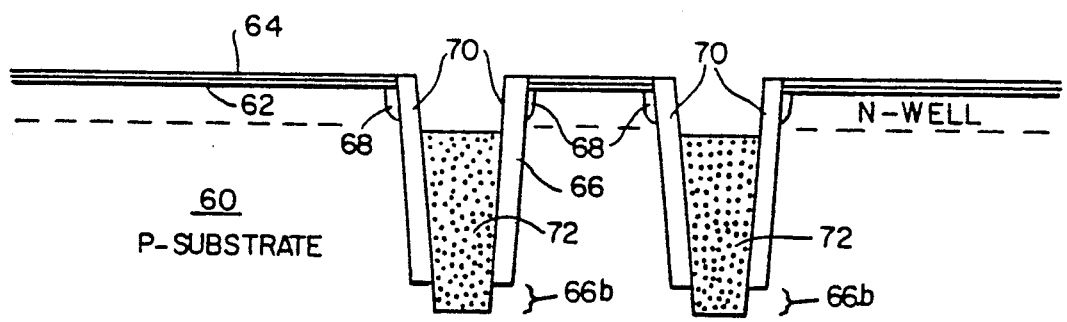

Referring to FIG. 11, after the approximately six micron deep trenches 66 are etched a 70 nm thick layer of $SiO_2$ is deposited by CVD, the layer being selectively RIE'd to form a spacer 70 around the inner surfaces of the trenches 66. After forming the spacers 70 the trenches 66 are further etched to an additional depth of approximately 0.2 microns to 0.4 microns, forming the extensions 66b. The trenches 66 are then filled with p+ polysilicon 72 to a height of approximately 5.5 microns from the bottom of the trench 66. This may be accomplished by filling the trench 66 with polysilicon, and then planarizing and recessing. The p+ polysilicon has a doping concentration approximately equal to that of the p+ substrate 60, the p+ polysilicon dopant concentration being approximately $10^{19}$ to $10^{20}$ boron ions/cm$^3$.

Figure 12:
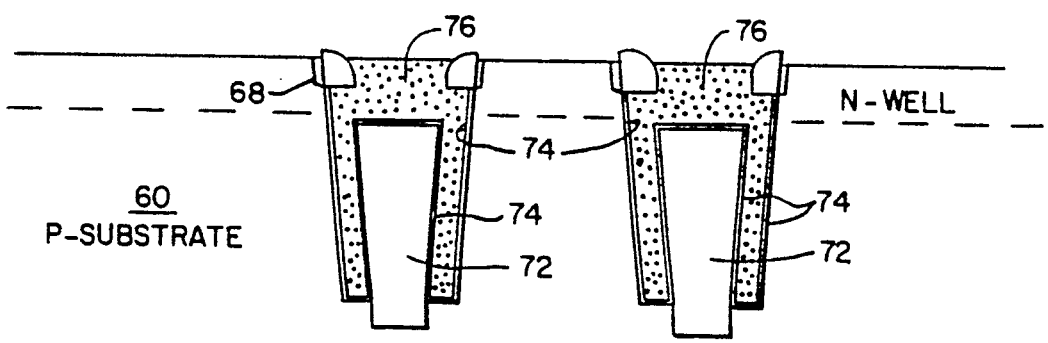

Referring to FIG. 12, the $SiO_2$ spacer 70 is removed using a buffered HF solution. The thin $Si_3N_4$ spacer 68 prevents the $SiO_2$ layer 62 from also being etched by the HF solution. This leaves, within each trench 66, an upstanding pedestal structure comprised of the p+ polysilicon 78. Each pedestal has a height of approximately 5.5 microns and top surface dimensions approximately 140 nanometers less than the lateral dimensions of the enclosing trench. Each pedestal structure is embedded into the p+ substrate 60, due to the additional trench extension 66b, and is thus electrically and physically coupled along bottom surfaces thereof to the p+ substrate 10. As in the embodiment of FIGS. 2-9 each pedestal may be considered to be an extension of the p+ substrate 60 up into the volume of the associated trench 66. As a result, the inner surface area of the p+ semiconductor material within each trench 66 is significantly increased over the trench structures taught by the prior art.

A next fabrication step forms a thin insulator layer 74 within the trench 66 and over the pedestal to form the capacitor 2 insulator. The insulator layer 74 may be readily formed by a thermal oxidation process. As was noted before, the slightly higher oxidation rate of the polysilicon 72 can be compensated for by decreasing the doping concentration of the polysilicon 72 relative to the substrate 60. The p+ substrate 60 together with the p+ polysilicon 72 inside the trench 66 form a plate of the storage capacitor 2. Next, approximately 400 nm of amorphous p+ polysilicon 76 is deposited, planarized, and recessed. If desired, an oxide collar 78 having a thickness of approximately 50 nm is deposited around the upper portion of the trench 66 above the recessed polysilicon 76. P+ polysilicon is again deposited and planarized to completely fill the trench 66, forming the capacitor 2 electrode. It should be noted that the capacitor electrode may be formed with n+ polysilicon if the array is not placed in n-well, as will be described.

Referring to FIG. 13, device isolation 78, such as STI or Local Oxidation of Silicon (LOCOS), is now formed. The STI 78 is preferably made self-aligned to the trench 66 to avoid density loss due to any alignment tolerance between the STI 78 and the trench 66. A gate oxide layer 80 is next formed, followed by approximately 150 nm of gate poly 82, approximately 200 nm of $Si_3N_4$ deposition 84, and gate poly patterning. If desired, a layer of aluminum oxide may be employed instead of the $Si_3N_4$ deposition 84. Using the poly etch mask, the gate poly over the trench 66 is removed. Alternatively, the poly lines may be discontinuous such that there poly lines are formed only where devices are formed, and not over the trench 66.

Referring to FIG. 14 p+ source/drain regions 86 are formed by ion implantation. $Si_3N_4$ spacers 88 for the gate poly 82 are also formed.

Referring to FIG. 15 approximately 400 nm of p+ polysilicon is blanketly deposited and planarized. The nitride cap 84 of the gate poly 82 may be used as a polish stop. The planarized p+ polysilicon is recessed and is patterned using a strap mask, by etching poly selective to silicide, to form polysilicide straps 90. In this regard the strap mask preferably overlaps the wordline poly. However, any overlapping portion of the deposited polycide strap 90 is removed during the planarization and recess. Thus, the strap 90 is beneficially self-aligned to the source/drain implants 86. This is followed by the blanket deposition of approximately 125 nm of $SiO_2$ 92, followed by planarization, and then the blanket deposition of approximately 100 nm of $Si_3N_4$ 93.

Referring now to FIG. 16 damascene polysilicon or tungsten wordlines are patterned as follows. For the damascene level a process similar to that employed for a damascene metal process can be employed. Grooves are patterned in the oxide and the $Si_3N_4$ layer 84 of the previously formed broken poly wordlines, as well as portions of the blanketly deposited $Si_3N_4$ layer 93, are etched. Broken poly wordlines are the previously referred to discontinuous poly lines that do not extend over the trench 66, as shown in FIG. 14. This step is followed by a blanket deposition of $Si_3N_4$ and anisotropic RIE'ing to form nitride spacers 96 inside of the etched groove. Blanket tungsten or polysilicon is deposited and planarization is performed as is typical for a damascene process.

Figure 17:
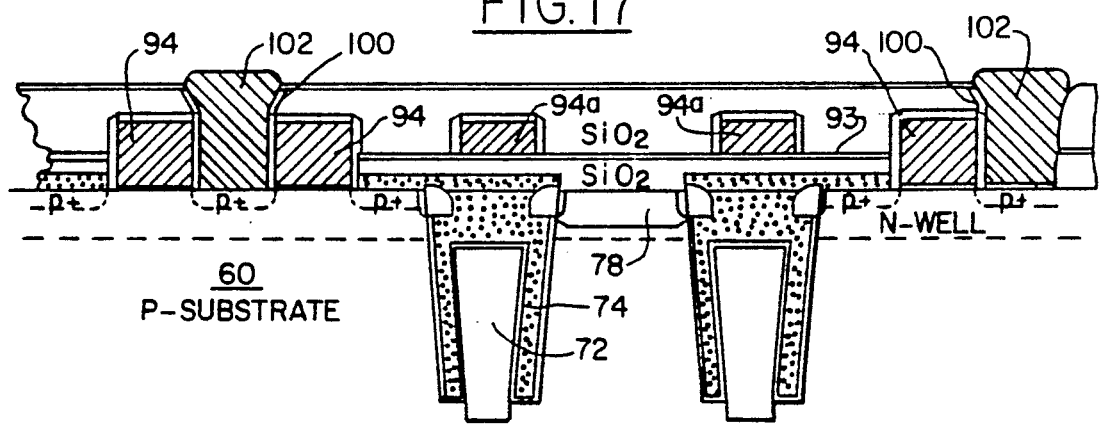

The tungsten or polysilicon is recessed to form the wordlines 94 and 94a and a $Si_3N_4$ or aluminum oxide layer 98 is deposited and planarized, thereby completing fabrication of the wordlines 94 and 94a. Referring to FIG. 17 approximately 300 nm of $SiO_2$ and 200 nm of $Si_3N_4$ are blanketly deposited. A contact mask is applied and contact holes are formed inside the oxide, etching $SiO_2$ selective to nitride and stopping on nitride. Nitride spacers 100 are formed by depositing 50 nm of $Si_3N_4$ and then anisotropically RIE'ing the nitride. Oxide is further etched stopping on nitride. The $Si_3N_4$ or $Al_2O_3$ over the tungsten protects the tungsten during this etch. Metal studs are formed inside of the contact holes by the CVD of tungsten, thereby forming bitline 3 contacts 102.

It is pointed out that the wordlines 94a formed over the trenches 66 are each vertically disposed above one of the straps 90. The is a significant improvement over prior art devices wherein wordlines and straps are horizontally disposed, thereby requiring a significant amount of additional surface area. It should be noted also that these vertically disposed wordlines 94a are surrounded, or "encapsulated", on four surfaces by electrical insulator (93, 96, 98). Furthermore, this embodiment of the invention teaches the fabrication of the wordline 94 in two steps, as illustrated in FIGS. 15 and 16, wherein the first step fabricates the wordline upon the substrate surface to a first thickness (82) and wherein a second step adds an additional thickness to form the wordline 94. Contemporaneously with the adding of the additional thickness the vertically disposed wordlines 94a are formed.

Figure 18:
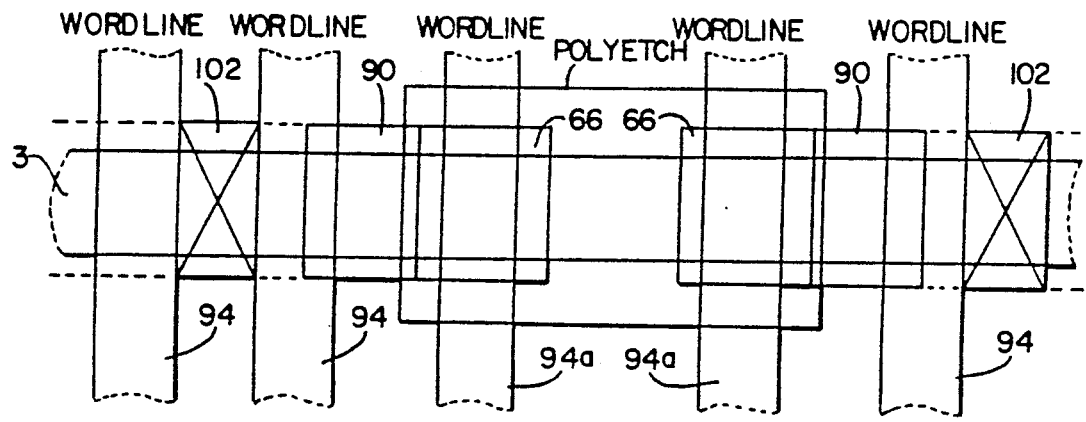
FIG. 18 is a plan view, not to scale, of a plurality of completed memory cells fabricated in accordance with the method illustrated in FIGS. 10-17.
Figure 19:
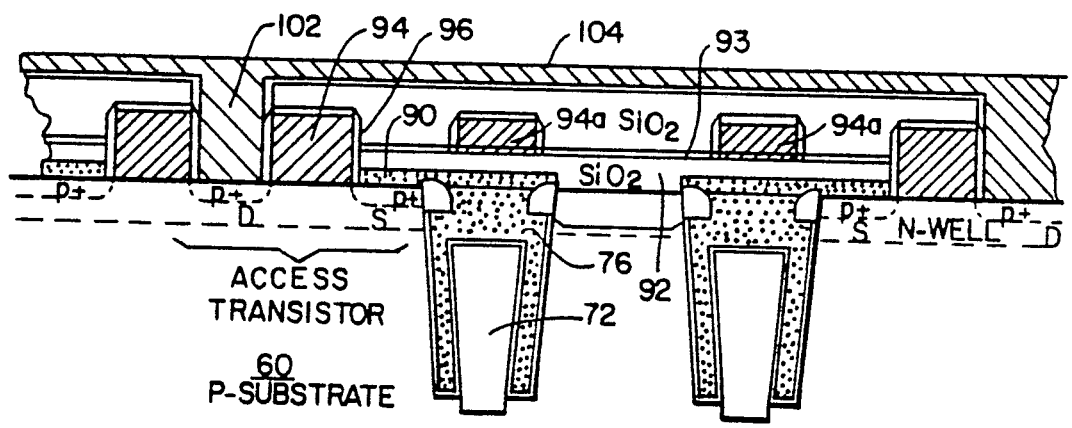
FIG. 19 is a cross-sectional view, not to scale, of the plurality of completed memory cells fabricated in accordance with the method illustrated in FIGS. 10-17.

Referring next to FIGS. 18 and 19 metal deposition 104 and bitline 3 patterning is next performed, completing the fabrication. As in the first embodiment of FIGS. 2-9 peripheral devices may be formed along with the formation of the access device.

In greater detail, a top view and a schematic vertical cross-section of the cell are shown in FIGS. 18 and 19, respectively. In accordance with the invention the storage capacitor 2 is placed inside of the trench 66, the trench having an increased surface area and, hence, a higher capacity than conventional trench capacitor devices. The polysilicon pillar 72 and the substrate 60 together form the capacitor cell plate. The outer polysilicon 76 forms the capacitor electrode and is connected to the source/drain of the access device through the polycide surface strap 90. The surface strap 90 is self-aligned to the access transistor 1. The $SiO_2$ insulation 92 over the surface strap 90 isolates the strap 90 from the passing wordline 4. The $Si_3N_4$ layer 96 insulates the wordlines 4 from the bitline contact 102 as well as from the surface strap 90. The bitline contacts 102 are self-aligned to the polysilicon gate 94 of the access transistor 1. STI is employed for device isolation and an oxide collar surrounds the top portion of the trench. This embodiment of the memory cell uses two levels of metal.

A cell layout for a 256 Mb DRAM, using the fabrication method of FIG. 10-19, has a folded bitline architecture, a cell area of 0.5 microns$^2$, and a minimum lithography dimension of 0.25 microns. A cell layout for a 64 Mb DRAM has a cell area of 0.98 microns$^2$, using 0.35 micron rules, for a folded bitline architecture.

In summary, two fabrication techniques have been disclosed, both being suitable for the fabrication of high density DRAM devices having trench capacitor cells and self-aligned planar access devices. Both techniques increase the trench inner surface area, and hence capacitance, by providing an upstanding p+ polysilicon pillar structure within the trench, the pillar structure being physically and electrically contiguous with the p+ substrate. The techniques are suitable for fabricating, by example, 256 Mb DRAM integrated circuits.

While the invention has been particularly shown and described with respect to preferred embodiments thereof, it will be understood by those skilled in the art that changes in form and details may be made therein without departing from the scope and spirit of the invention.

Having thus described my invention, what I claim as new, and desire to secure by Letters Patent is:

1. A trench capacitor formed within an integrated circuit, comprising:
    a substrate having a depression within a surface thereof; and
    capacitor means formed within the depression, the capacitor means including a first plate electrode means having a surface area comprised of an inner surface area of the depression and an outer surface area of a pillar structure extending upwardly from a bottom surface of the depression, the pillar structure being physically and electrically contiguous with the substrate, the capacitor means further including a second plate electrode means comprised of a region of electrically conductive material that substantially fills a volume of the depression not occupied by the pillar structure, the capacitor means further comprising a thin layer of dielectric material interposed between the first plate electrode means and the second plate electrode means.

2. A trench capacitor as set forth in claim 1 wherein the substrate is comprised of monocrystalline silicon having a first type of electrical conductivity and wherein the pillar structure is comprised of polycrystalline silicon also having the first type of electrical conductivity.

3. A trench capacitor as set forth in claim 2 wherein the first type of electrical conductivity is p-type and wherein the monocrystalline silicon and the polycrystalline silicon each have an impurity doping concentration of greater than approximately $10^{19}$ atoms/cm$^3$.

4. A trench capacitor as set forth in claim 2 wherein the substrate includes a surface region surrounding the depression, the surface region having a second type of electrical conductivity and a depth that is approximately equal to or less than a distance of a top of the pedestal structure from the surface of the substrate.

5. A trench capacitor as set forth in claim 1 and further comprising an electrically conductive strap disposed over the surface of the substrate for electrically coupling the second plate electrode to a terminal of a planar access device.

6. A trench capacitor as set forth in claim 5 wherein the strap is self-aligned to the terminal.

7. A trench capacitor as set forth in claim 5 and further comprising a layer comprised of an electrical insulator that overlies the conductive strap for electrically insulating the conductive strap from any overlying electrically conductive regions.

8. A trench capacitor as set forth in claim 5 and further comprising a wordline conductor that is vertically disposed above the conductive strap, the wordline conductor being electrically insulated from the conductive strap.

9. A trench capacitor as set forth in claim 1 wherein the depression has a substantially square or rectangular top surface area and a depth of approximately six microns.

10. A trench capacitor as set forth in claim 1 wherein a top surface area of the depression has dimensions of approximately one micron by approximately 1.2 microns and a depth within a range of approximately 4.5 microns to approximately six microns.

11. A trench capacitor as set forth in claim 1 wherein a bottom surface of the pillar structure is disposed upon the bottom surface of the depression.

12. A trench capacitor as set forth in claim 1 wherein a bottom surface of the pillar structure is embedded within the substrate and extends by a given depth below the bottom surface of the depression.

13. A trench capacitor as set forth in claim 12 wherein the given depth is within a range of approximately 0.1 to approximately 0.25 microns.

14. A trench capacitor as set forth in claim 1 wherein the dielectric material has a thickness of approximately 60 Angstroms to approximately 100 Angstroms.

15. A trench capacitor as set forth in claim 1 wherein the surface of the substrate has a region of Shallow Trench Isolation formed therein for electrically insulating the trench capacitor from an adjacent trench capacitor.

16. A trench capacitor as set forth in claim 1 wherein the depression includes an electrically insulating collar disposed around a top portion thereof.

17. A method of fabricating a trench capacitor within an integrated circuit, comprising the steps of:

providing a substrate having a major surface, the substrate being comprised of a semiconductor material having a first type of electrical conductivity;

removing a portion of the substrate to form a trench that extends from the major surface down into the substrate to a predetermined depth;

forming an upstanding pedestal structure within the trench, the pedestal structure being formed to extend upwardly from a bottom surface of the trench to a height that is less than the predetermined depth, the pedestal structure being comprised of a semiconductor material having the first type of electrical conductivity;

covering exposed inner surfaces of the trench and exposed outer surfaces of the pedestal structure with a layer comprised of an electrical insulator; and filling a remaining volume of the trench with an electrically conductive material, whereby the inner surfaces of the trench and the outer surfaces of the pedestal structure form a first plate of a capacitor means, the layer of electrical insulator forms a capacitor means dielectric, and surfaces of the electrically conductive material that are in contact with the layer of electrical insulator form a second plate of the capacitor means.

18. A method as set forth in claim 17 and further comprising the steps of:

fabricating a planar access device upon the surface of the substrate; and electrically coupling a terminal of the planar access device to the electrically conductive material.

19. A method as set forth in claim 18 wherein the step of electrically coupling includes a step of depositing a silicide strap such that the silicide strap is self-aligned to the terminal and such that the silicide strap also overlies and is conductively coupled to a portion of the electrically conductive material that fills the trench.

20. A method as set forth 19 and further including a step of fabricating a wordline conductor such that is vertically disposed over the silicide strap.

21. A method as set forth in claim 17 and further including a step of fabricating a plurality of wordlines, wherein a first plurality of wordlines are fabricated upon the major surface of the substrate by a two-step process that includes a first step of forming a wordline to a first thickness and a second step of increasing the first thickness by a second thickness to a third thickness.

22. A method as set forth in claim 21 wherein a second plurality of wordlines are fabricated such that each is vertically disposed above the major surface of the substrate and enclosed within an electrical insulator.

23. A method as set forth in claim 22 wherein the second plurality of wordlines are fabricated contemporaneously with the second step of increasing the first thickness by the second thickness.

24. A memory cell, comprising;

a trench capacitor formed within an opening into a semiconductor substrate, the trench capacitor including first plate electrode means and second plate electrode means having a dielectric material interposed therebetween; and an access device having a first terminal coupled to the second plate electrode means, wherein the first plate electrode means has a surface area that includes an inner surface area of the opening and an outer surface area of a structure that extends into the opening from a bottom surface of the opening, the structure being electrically coupled to the semiconductor substrate, and wherein the second plate electrode means is comprised of an electrically conductive material that overlies the dielectric material.

25. A memory cell as set forth in claim 24 wherein the structure is comprised of polycrystalline silicon.

26. A memory cell as set forth in claim 24 wherein the first terminal of the access device is coupled to the second plate electrode means with an electrically conductive strap disposed over the surface of the substrate.

27. A memory cell as set forth in claim 24 and further comprising a wordline conductor coupled to a second terminal of the access device and a bitline conductor coupled to a third terminal of the access device.

* * * * *